United States Patent [19]

Rockwell

[11] Patent Number: 4,859,813

[45] Date of Patent: Aug. 22, 1989

[54] DIGITIZER TABLET HAVING ELECTRICAL INTERCONNECT COMPONENTS ON THE WRITING SUBSTRATE

[75] Inventor: Lynn H. Rockwell, Mesa, Ariz.

[73] Assignee: CalComp Inc., Anaheim, Calif.

[21] Appl. No.: 93,483

[22] Filed: Sep. 4, 1987

[51] Int. Cl.⁴ ............................................ G08C 21/00
[52] U.S. Cl. ........................................ 178/18; 178/19
[58] Field of Search ............................. 178/18, 19, 20

[56] References Cited

U.S. PATENT DOCUMENTS

| | | | |
|---|---|---|---|
| 3,818,133 | 6/1974 | Cotter | 178/18 |
| 3,886,311 | 5/1975 | Rodgers et al. | 178/18 |
| 4,096,022 | 6/1978 | Crawford | 156/577 |
| 4,213,005 | 7/1980 | Cameron | 178/18 |
| 4,356,505 | 10/1982 | Lovinger et al. | 357/72 |
| 4,433,223 | 2/1984 | Larson et al. | 200/159 B |
| 4,456,652 | 6/1984 | Konishi et al. | 428/344 |
| 4,460,804 | 7/1984 | Svejkovsky | 174/117 |
| 4,513,043 | 4/1985 | Smades | 428/113 |
| 4,524,087 | 6/1985 | Engel | 427/2 |
| 4,548,862 | 10/1985 | Hartman | 428/323 |
| 4,554,033 | 11/1985 | Dery et al. | 156/52 |
| 4,568,602 | 2/1986 | Stow | 428/172 |
| 4,569,877 | 2/1986 | Tollefson et al. | 428/141 |
| 4,588,762 | 5/1986 | Mruk et al. | 524/45 |
| 4,606,962 | 8/1986 | Reylek et al. | 428/148 |
| 4,610,908 | 9/1986 | Reylek et al. | 428/141 |
| 4,624,801 | 9/1986 | Kawaguchi et al. | 252/500 |

FOREIGN PATENT DOCUMENTS 2086368  5/1982  United Kingdom .

OTHER PUBLICATIONS

IBM Technical Disclosure Bulletin, Analog Data Tablet, vol. 23, No. 2, Jul. 1980.

*Primary Examiner*—Stafford D. Schreyer
*Attorney, Agent, or Firm*—Nutter, McClennen & Fish

[57] ABSTRACT

A digitizing tablet for use in conjunction with a stylus and a digitizing circuit capable of generating signals representative of the position of the stylus on the digitizing tablet is disclosed. The digitizing tablet includes a sheet of glass that functions as the writing surface over which the stylus is disposed. On the underside of the glass, opposite the writing surface, there are lines of conductive ink that have been applied as two sets of parallel lines that intersect perpendicularly so as to form a grid. A dielectric ink is applied over the conductive ink to serve as a protective coating and an insulator to prevent current flow at the points the lines intersect. The lines of conductive ink terminate at surface contact pads also formed of conductive ink. Electrical components can be surface mounted to the digitizing tablet at the surface contact pads by the use of a solder, conductive adhesive or other conductive bonding media.

11 Claims, 4 Drawing Sheets

DIGITIZER TABLET HAVING ELECTRICAL INTERCONNECT COMPONENTS ON THE WRITING SUBSTRATE

FIELD OF THE INVENTION

This invention relates to digitizing tablets, and in particular to a digitizing tablet with sets of parallel conductors formed from conductive ink.

BACKGROUND OF THE INVENTION

A digitizing tablet is a part of a digitizing device that, in conjunction with a stylus, is used to generate digital signals representative of the position of the stylus on the tablet. Digitizing devices are often used with data processing equipment to allow the operator to input information that can best be expressed in multi-dimensional analog terms. For instance, a digitizing device can be used in conjunction with computer aided design equipment to enable the operator to input where features of the item being designed should be located. Digitizing devices can also be used as part of a communications system to enable the users to transmit and receive digital representations of analog information; for example, a digitizing device can be used to transmit handwritten material such as a signature for verification by comparison to a standard stored in a database.

A typical digitizing tablet is provided with two sets of parallel grid conductors. The individual grid conductors are spaced apart from each other and the sets are arranged perpendicular to each other so as to form an X-Y grid of rectangular sections separated by the conductors. The digitizing device includes a digitizing circuit associated with the conductors and stylus that generates a digital output representative of the position of the stylus on the digitizing tablet. In one type of digitizing circuit, a coil inside the stylus is periodically energized and sensors associated with the grid conductors provide an indication of where the stylus is on the digitizing tablet. In another type of digitizing circuit, the grid conductors are driven in succession and the resultant signal induced in a coil in the stylus is then sensed; the time of occurrence and strength of the sensed signal is then used to provide an indication of the location of the stylus. The signals sensed relative to the X-grid conductors provide a indication of where the stylus is in relation to a Y-reference line; the signals sensed relative to the Y-grid conductors provide an indication of where the stylus is relative to an X-reference line. The combination of the signals sensed relative to both the X and Y grid conductors provides an indication of the location of the stylus on the digitizing pad.

Advances in electronics technology have made it possible to interpolate the position of the stylus between parallel grid conductors. This has made it possible to provide digitizing devices that generate an output of the position stylus on the digitizing tablet with a very high degree of accuracy.

An important consideration in the design of a digitizing device is providing a digitizing tablet with grid conductors that are as parallel as possible with respect to the other conductors in the set, and that have substantially identical electrical characteristics. These considerations are important because the signals sensed and processed by the digitizing circuit relative to identical positions between grid conductors should be identical everywhere on the digitizing tablet in order to consistently generate accurate signals representing the stylus' location.

One of the few types of digitizing tablets that, to date, is provided with grid conductors of substantially identical electrical characteristics and has good parallel geometry, is a wire grid digitizing tablet. A wire grid digitizing tablet includes two sets of parallel wires that are spaced apart and perpendicular to each other. Typically, the wires are encased in a resin layer that hold the wires in place and serves as an electrical insulator between them. The resin layer, with the wires embedded therein, is bonded to a glass substrate. The digitizing tablet is incorporated into a standard digitizer device known in the art. A wire grid digitizing tablet is assembled by first stringing the wires to a frame below which the glass substrate is secured; applying a resin that is in a liquid state to the glass so that the wires are coated; and curing and applying pressure to the resin so a thin, solid layer of wire embedded resin, bonded to the glass substrate, is formed. A more detailed description of wire grid digitizing tablets, and the method for constructing them, is set forth in U.S. Pat. No. 4,513,043 which is incorporated herein by reference.

There are a number of disadvantages associated with wire digitizing tablets. One disadvantage is associated with the curing of the resin after it is applied to the glass substrate. In order to cure the resin, it is exposed to ultra violet light. As a consequence of the resin curing, and its exposure to the ultra violet light, heat, known as exotherm, is released by the resin. The heat causes the resin to shrink which in turn may cause the wires embedded therein to bend or become displaced. Controlling the resin's exposure to the ultra violet light only partially reduces the exotherm and subsequent distortion of the wires embedded within it. Lumps or viscosity inconsistencies within the uncured resin can cause the resin to shrink in an irregular pattern so as to further disrupt the pattern of the wires therein. The fabrication of these digitizer tablets is further complicated because there are slight variations in the chemical composition of the different batches of resin used to form the tablets. Accordingly, the resins from the various batches have differing exotherm rates which contribute to the difficulty of controlling the shrinkage when the individual resin layers tablets are cured.

Moreover, the current digitizing tablets are assembled out of costly components that are very difficult to assemble and that must be assembled together with a significant degree of accuracy. As a result, the current digitizing tablets are relatively expensive to manufacture.

Furthermore, all digitizing tablets must be provided with a means to interconnect the grid conductors to the digitizing circuit. Current digitizing tablets do not include an integral structure or member where such interconnects can readily be made. Consequently, current digitizing tablets are often provided with a relatively expensive interconnect coupler, with a mechanical fastener means attached thereto, to make the necessary connections to the digitizing circuits to which they are connected. Frequently, these interconnect couplers are fragile devices that are prone to break off of the tablets.

SUMMARY OF THE INVENTION

It is an object of this invention to provide a digitizing tablet that can be assembled with a minimal amount of difficulty and is relatively economical to manufacture.

It is another object of this invention to provide a digitizing tablet that is provided with a means to readily mount electrical components and provide electrical connections thereto.

It is still a further object of this invention to provide a digitizing tablet which is not subject to thermal and hydrophilic expansion and contractions with the attendant loss of digitizing accuracy they cause.

These, and other objects of this invention, are provided by a digitizing tablet provided with a plate of glass or other rigid, insulating material that serves as the surface of the digitizing tablet. Lines of conductive ink are applied to the surface of glass opposite the surface on which the stylus is to be disposed. The lines of conductive ink are applied to the glass as two sets of parallel lines that are orthogonal to each other so as to function as the grid conductors of the digitizing tablet. Dielectric ink is applied over the conductive ink to serve as a protective coating and as an insulator so that at the points the perpendicular grid conductors cross, current will not flow therethrough.

The lines of conductive ink are also arranged to terminate at solder pads that are also applied to the surface of the glass. Electrical components, or sockets for electrical components, can be electrically connected to the grid conductors by surface mounting them to the solder pads using solder, conductive adhesive, or other media.

There are a number of advantages associated with the digitizing tablet of this invention. The parallel lines of conductive ink that function as the grid conductors can be applied to the glass with a minimal amount of difficulty. The material needed to assemble this digitizing tablet is relatively inexpensive. Thus, this digitizing tablet is economical to manufacture.

The glass of this digitizing tablet has low coefficients of thermal and hydrophilic expansion. Thus, neither the glass or grid conductors are substantially affected by changes in the ambient temperature or humidity to which the digitizing tablet may be exposed. Accordingly, the distances between the lines of conductive ink do not vary so as to cause the digitizing circuit to generate an output that inaccurately represents the location of the stylus on the digitizing tablet.

Another advantage of this digitizing tablet is that the grid conductors can be readily connected to the associated digitizing circuitry at the solder pads using solder or other appropriate conductive media. There is no need to provide this digitizing tablet with relatively costly and fragile interconnect couplers to make the necessary connections between the grid conductors and the digitizing circuitry.

DETAILED DESCRIPTION OF THE INVENTION

Figure 1:
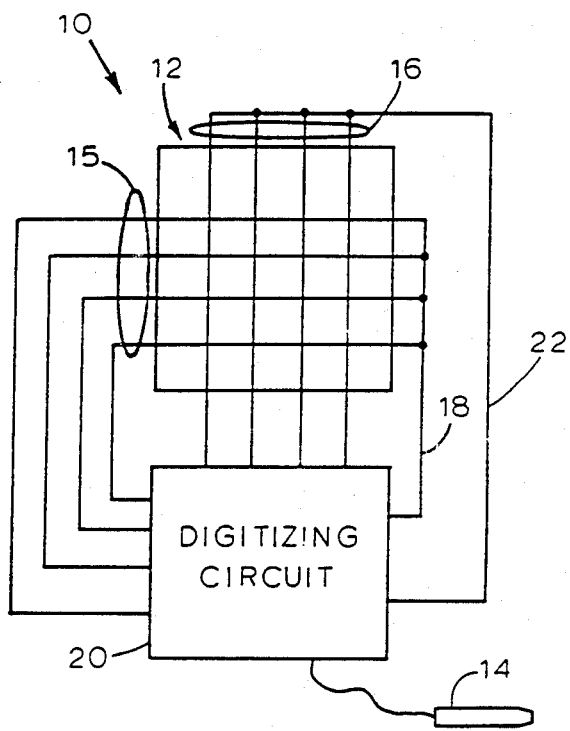
FIG. 1 is a block diagram of a digitizer of the type that would employ a digitizing tablet of the present invention.

FIG. 1 depicts a typical digitizer 10 provided with a digitizing tablet 12. The digitizing tablet 12 has a writing surface over which a stylus 14 is disposed and an underside surface, opposite the writing surface. On the underside surface of the digitizing tablet 12 are first and second sets of parallel grid conductors 15 and 16 that run perpendicular to each other. All of the conductors of the first grid conductor set 15 are connected at one end to a common conductor 18 which connects to a digitizing circuit 20. The other ends of the grid conductors 15 are connected individually to the digitizing circuit 20, which includes a switch for each of the conductors to select the conductor whose signals will be sensed. Similarly, the conductors of the second grid conductor set 16 are connected by a second common line 22 to the digitizing circuit 20, and they are connected individually at their other ends to the circuit 20.

The stylus 14 is also connected to the digitizing circuit 20. The digitizing circuitry 20 drives a coil located on the tip of the stylus 14 to cause it to generate an electromagnetic field. When the stylus 14 is brought to the grid surface 12, it induces electrical signals in the first and second sets of grid conductors 15 and 16. The digitizing circuit 20 senses the signals on each of the conductors in succession to determine which conductors carry signals of greatest amplitude. The signals of greatest amplitude are generated in the grid conductors at the perimeter of the coil in the stylus 14, and the digitizing circuit 20 determines the ratios of the signal amplitudes of the two strongest signals in each set of grid conductors 15 and 16 and from this determines the position of the stylus. In response, it generates position-indicating output signals over output lines not shown.

Figure 2:
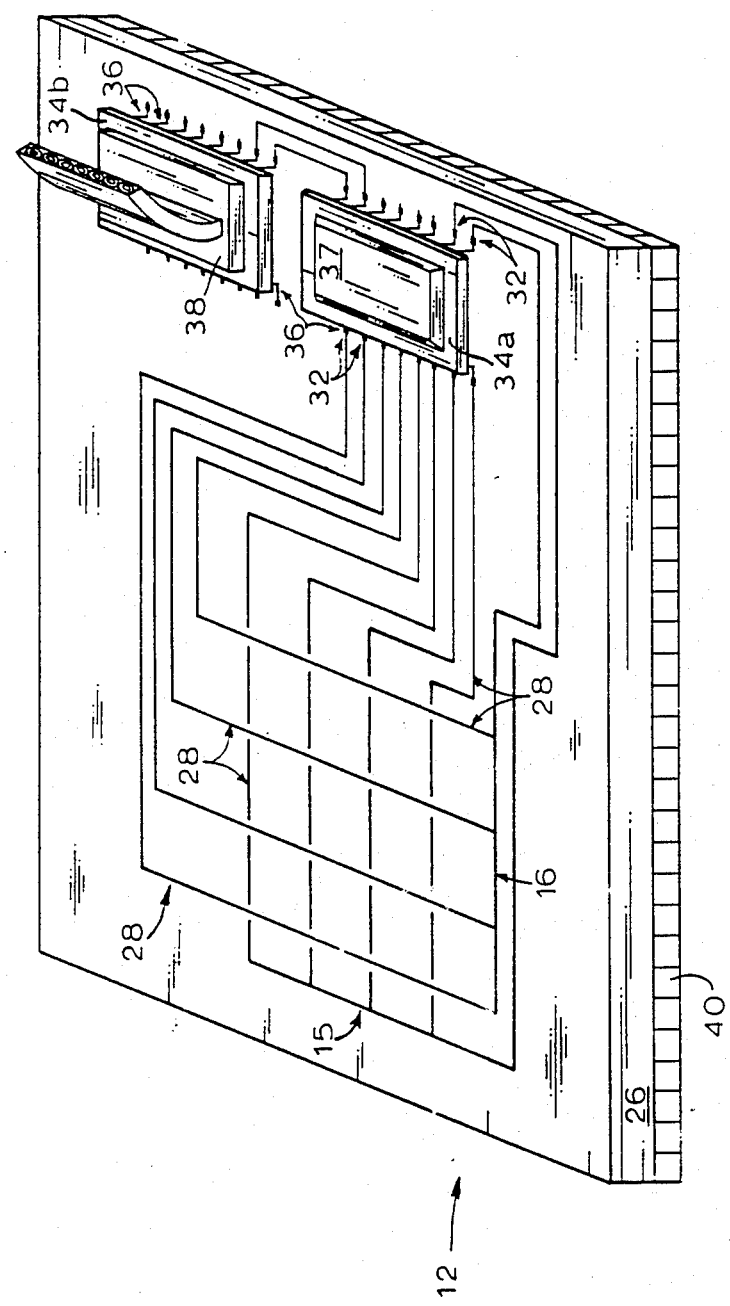
FIG. 2 is a front perspective view of the underside of a digitizing tablet of the present invention.

Referring to FIG. 2, the digitizing tablet 12 is shown in greater detail to include a sheet of glass 26 that functions as the writing surface for the stylus 14. Lines of conductive ink 28 are applied to the undersurface of the glass 26 opposite the writing surface. The lines of conductive ink 28 are arranged in two sets of parallel lines that are perpendicular to each other so as to function as the first and second sets of grid conductors 15 and 16.

Figure 3:
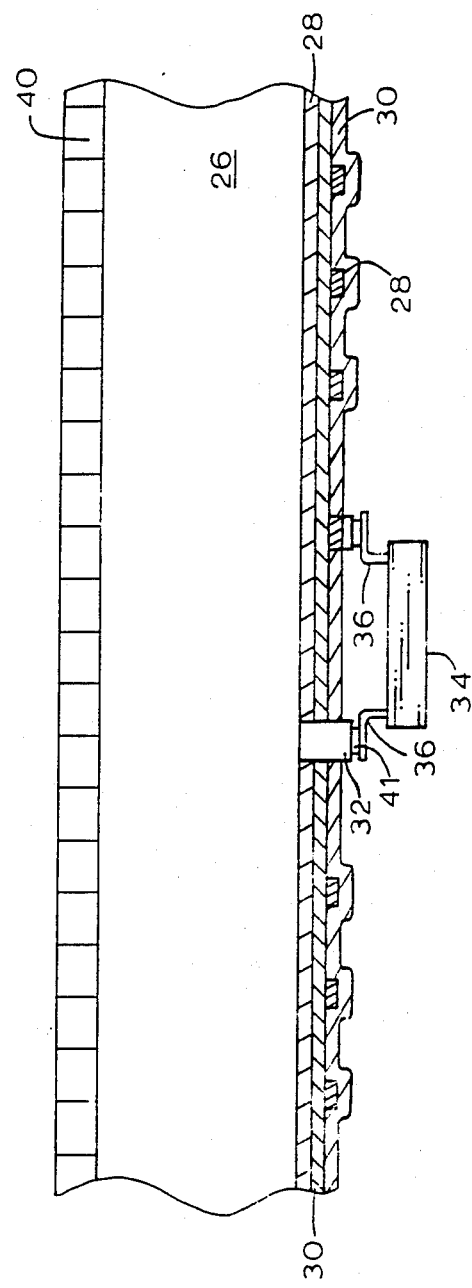
FIG. 3 is a cross-section view of the digitizing tablet of the present invention including an electrical component surface mounted therein.

As best seen by reference to FIG. 3, each line of conductive ink 28 is entirely covered by a layer of dielectric ink 30. In the illustrated embodiment, the dielectric ink 30 is applied so it covers almost the entire portion of the surface of the glass 26 the conductive ink 28 is applied to. Two layers of dielectric ink 30 are applied to the glass 26, one layer is applied after each layer of conductive ink 28 has been applied to it. The dielectric ink 30 functions as a protective covering over the conductive ink 28, and at points where the first and second sets of grid conductors 15 and 16 cross, functions as insulation to prevent current flow therebetween.

The lines of conductive ink 28 are arranged so they terminate at surface contact pads 32 on the glass 26. Electrical components 34, which comprise at least part of the digitizing circuit 20, are surface mounted to the glass 26 at the surface contact pads 32. A conductive bonding media 41 such as solder, or conductive adhesive, is used to bond conductive leads 36 of the electrical components 34 to the surface contact pads 32 they are in electrical contact therewith. Typically the electrical component 34 directly mounted to the glass 26 is either a socket 34a adapted to receive a functioning component 37, or a socket 34b adapted to receive conductors, such as a ribbon connector 38, used to make connections to circuit elements mounted at locations remote to the digitizing tablet 12.

The digitizing tablet 12 of this invention is assembled by first applying lines of conductive ink 28 to the glass that functions as the first set of grid conductors 15. The conductive ink 28 is applied by processes known in the art, such as silk screening. After the conductive ink 28 forming the first set of conductors has been applied and cured, the first layer of dielectric ink 30 is applied over it, again by a known process such as silk screening, and cured. The wires of conductive ink 28 forming the second set of grid conductors 16 are then applied to the glass 26, and after they cure, the second layer of dielectric ink 30 is applied over them. When the grid conductors 15 and 16 are formed, the surface contact pads 32 are formed so they are integral with them. The dielectric ink 30 is applied in such a manner that it does not cover the surface contact pads 32 that are formed with the grid conductors 15 and 16. Suitable conductive ink 28 and dielectric ink 30 for this digitizing tablet may be obtained from the Amicon Company of Lexington, Mass.

After the grid conductors 15 and 16 and the surface contact pads 32 are formed, the electrical components 34 are mounted to the digitizing tablet 12. If the conductive bonding media 41 is a conductive adhesive, the electrical components 34 are mounted by first applying the conductive adhesive to the digitizing tablet 10 over the surface contact pads through a metal stencil with openings where the surface contact pads are located. Immediately after the conductive adhesive is applied, before it has an opportunity to cure, the electronic components 34 are surface mounted on the glass 26 so their leads 36 are disposed in the conductive adhesive. The conductive adhesive has sufficient adhesive qualities so that after it cures, the electronic components 34 will be bonded thereto. A suitable conductive adhesive may be obtained from the same source that can provide the conductive ink and the dielectric ink.

A layer of Lexan 40, or other suitable pliant material, is then bonded to the surface of the glass 26 over which the stylus 14 is to be disposed. The Lexan 40 has a texture that gives the writing surface of the digitizing tablet 12 a paper or pad-like feel.

The glass 26 of this digitizing tablet 12 has very low thermal and hydrophilic coefficients of expansion. Therefore, there is substantially no possibility that the digitizing tablet 12 will expand or contract as the temperature and humidity of the tablet's ambient environment changes. Accordingly, it is improbable the spacing between the grid conductors 15 and 16 will change so as to cause the digitizing circuit 20 to generate signals that inaccurately represent the position of the stylus 14.

The conductive ink 28 can be applied to the glass 26 in such a manner that the lines of ink formed have excellent electrical characteristics. The individual lines of ink are extremely straight. The lines of conductive ink can be positioned from each other so that the lines of conductive ink 28 forming each set of grid conductors have excellent parallel spacing characteristics and are spaced apart from each other a constant distance that does not vary between pairs of spaced apart conductors. Moreover, the conductive ink 28 can be accurately applied so the sets of grid conductors 15 and 16 intersect at the exact angle they are designed to intersect at.

Furthermore, applying the conductive ink 28 and dielectric ink 30 to the glass 26 to form the parallel lines that comprise the grid conductors is neither a difficult nor costly task. The material needed to assemble this digitizing tablet is relatively inexpensive. Thus, this digitizing tablet 12 is economical to fabricate.

Further production economics are obtained with this digitizing tablet 12 since it readily accommodates electrical components 34 that can be surface mounted to the digitizer tablet so as to provide a ready connection to the grid conductors 15 and 16. This eliminates the expense of having to provide costly and fragile interconnect couplers that extend between the digitizing tablet 12 and the associated digitizing circuitry 20.

Figure 4A:
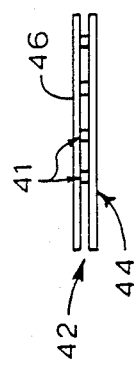
FIGS. 4 and 4a illustrate a transfer sheet used to apply conductive adhesive to the digitizing tablet so the surface components may be mounted thereon, and the use of the transfer sheet to apply the conduct adhesive.
Figure 4:
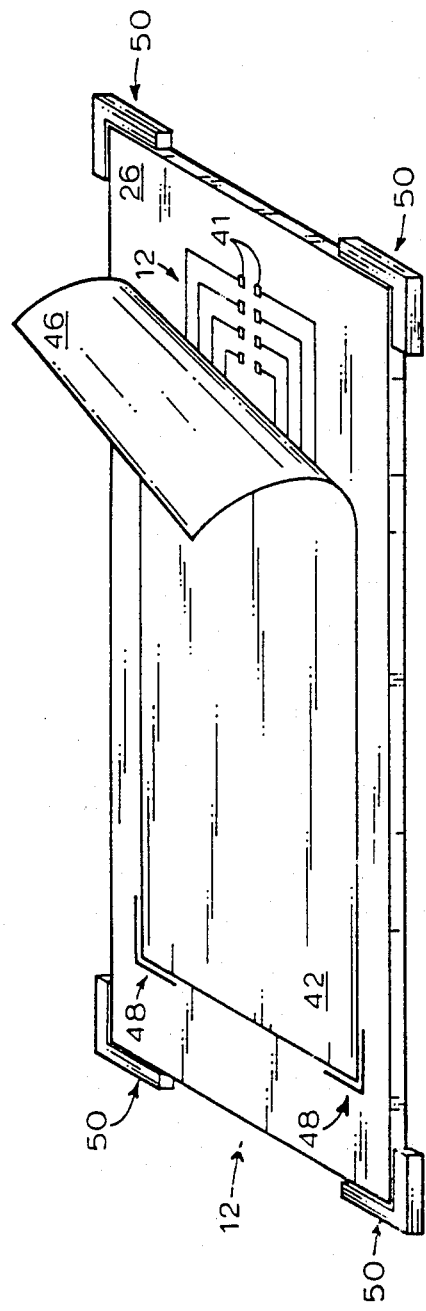

FIGS. 4 and 4a illustrate an alternative method of applying the conductive bonding media 41 to the digitizing tablet 12. The conductive bonding media 41 is in the form of a solvent based, partially cured conductive adhesive that has been first applied to a transfer sheet 42. The transfer sheet includes a release liner 44 with a wax-like surface that the conductive adhesive is initially applied to. The conductive adhesive is applied to the release liner 44 in the pattern that is to be applied to on the digitizing tablet 12. A main substrate 46 formed of sheet of flexible material such as Lexan, Mylar, or other suitable material is disposed on the release liner 44 over the applications of adhesive 41. The surface of the main substrate 46 adjacent the adhesive 41 is coated with a release agent such as silicon.

The conductive adhesive forming the conductive bonding media 41 is applied to the digitizing tablet 12 by first removing the release liner 44 from the transfer sheet 42. The main substrate 46, with the conductive adhesive thereon, is positioned on the digitizing tablet 12 with the aid of alignment lines 48 on the glass 26. The digitizing tablet 12 is held in position by alignment blocks 50 affixed to the work station. After the main substrate 46 is aligned on the digitizing tablet 12, pressure is applied to the outer surface of the main substrate 46 so the conductive adhesive adheres to the surface contact pads 32 on the glass 26. The main substrate 46 is then removed, leaving the adhesive on the substrate. Before the conductive adhesive is allowed to cure, the electronic components 34 are mounted thereto so when the adhesive cures, they will be bonded to the digitizing tablet 12.

This description is for the purpose of description only. Alternative embodiments of this invention are possible without departing from the scope of the claims. In some embodiments it may not be necessary to apply dielectric ink 30 over substantially the entire surface of the glass 26. For example, it may desirable to only apply apply the dielectric ink 30 so that it only covers the lines of conductive ink 28. For instance, if the lines of conductive ink 28 are approximately 50 mils wide, lines of dielectric ink 30 250 mils wide may be applied over them. Alternatively, in some embodiments of this invention it may be desirable to only apply an insulating material at the point the grid conductors 15 and 16 intersect.

In still other embodiments of this invention, it may be desirable to terminate the lines of conductive ink at conductive contact pads located around the perimeter of the digitizing tablet; the digitizing tablet could then be mounted in a frame that is provided with edge connectors that make electrical contact with the grid conductors through the perimeter-located contact pads. Alternative material other than glass can be used as the surface of the digitizing tablet, and conductive and dielectric inks other than those described can be used to form the grid conductors. Moreover, any convenient means can be used to apply the conductive and dielectric inks to the digitizing tablet, and to provide the surface mount assembly.

Therefore, it is the object of the appended claims to cover all such variations and modifications as come within the true scope and spirit of the invention.

What is claimed as new and desired to be secured by Letters Patent of the United States is:

1. A digitizing tablet for use with a stylus and digitizing circuit generating signals representative of the position of the stylus on the digitizing tablet, the digitizing tablet comprising:
   (a) a rigid substrate of dielectric material having a first, writing side over which the stylus is to be disposed, and a second, underside opposite said writing side;
   (b) grid conductors disposed on said rigid substrate underside, said grid conductors including a first and second set of parallel, spaced apart conductors, said first and second sets of conductors disposed at any angle to each other said grid conductors formed of electrically conductive ink;
   (c) a layer of dielectric ink applied on said rigid substrate at least between the points said first and second grid conductors intersect; and
   (d) an electrical interconnect means on said rigid substrate integral with said grid conductors to provide a conductive path between said grid conductors and the digitizing circuit.

2. The digitizer tablet of claim 1 wherein said first and second sets of grid conductors intersect at a substantially perpendicular angle to each other.

3. The digitizer tablet of claim 1 wherein at least one of said grid conductors is in electrical communication with a conductive surface contact pad on said rigid substrate, said surface contact pad suitable for securing an electrical component thereto so as to provide a conductive path between said grid conductor and said component.

4. The digitizer tablet of claim 3 wherein at least one of said grid conductors terminate at a conductive pad.

5. The digitizer tablet of claim 1 wherein said rigid substrate comprises a sheet of glass.

6. The digitizer tablet of claim 1 wherein a layer of pliant material is disposed on said rigid substrate writing surface.

7. The digitizer tablet of claim 1 further including said first set of parallel conductors disposed on said rigid substrate underside, a first layer of dielectric ink is disposed on said underside over said first set of parallel conductors, said second set of parallel conductors is disposed over said first layer of dielectric ink, and a second layer of dielectric ink is disposed over said second set of parallel conductors.

8. The digitizer table of claim 7 further including said first layer of dielectric ink disposed over substantially the entire surface of said rigid substrate underside subtended by said grid conductors.

9. The digitizer tablet of claim 7 further including said second layer of dielectric ink disposed over substantially the entire surface of said rigid substrate underside subtended by said grid conductors.

10. The digitizer tablet of claim 1 further including said first set of parallel conductors disposed on said rigid substrate underside, a first set of lines of dielectric ink is disposed on said underside over said first set of parallel conductors, said second set of parallel conductors are disposed on said underside over said first set of lines of dielectric ink, and a second set of lines of dielectric ink is disposed on said substrate over said second set of parallel conductors.

11. The digitizer tablet of claim 1 wherein said grid conductors are a transducer means adapted for transferring power with a complementary transducer in the stylus to generate signals in said grid conductors and in said stylus transducer that are monitored by the digitizing circuit to generate the signals representative of the position of the stylus on the digitizing tablet.

* * * * *